US007120851B2

(12) United States Patent
Ting et al.

(10) Patent No.: US 7,120,851 B2
(45) Date of Patent: Oct. 10, 2006

(54) RECURSIVE DECODER FOR SWITCHING BETWEEN NORMALIZED AND NON-NORMALIZED PROBABILITY ESTIMATES

(75) Inventors: Yu Jing Ting, Singapore (SG); Noriyoshi Ito, Hachioji (JP); Hiroshi Katsuragawa, Singapore (SG)

(73) Assignee: Oki Techno Centre (Singapore) PTE LTD, Singapore (SG)

( * ) Notice: Subject to any disclaimer, the term of this patent is extended or adjusted under 35 U.S.C. 154(b) by 437 days.

(21) Appl. No.: 10/649,785

(22) Filed: Aug. 28, 2003

(65) Prior Publication Data

US 2004/0083252 A1 Apr. 29, 2004

(30) Foreign Application Priority Data

Aug. 30, 2002 (SG) .............................. 200205257-9

(51) Int. Cl.
*H03M 13/00* (2006.01)
*H03M 13/03* (2006.01)

(52) U.S. Cl. ...................... 714/755; 714/794; 375/262; 375/341

(58) Field of Classification Search ................ 714/755, 714/794; 375/262, 341
See application file for complete search history.

(56) References Cited

U.S. PATENT DOCUMENTS 6,304,996 B1 * 10/2001 Van Stralen et al. ........ 714/796
6,871,316 B1 * 3/2005 Wong et al. ................. 714/796
6,961,921 B1 * 11/2005 Hepler et al. ............... 714/796
2002/0048331 A1    4/2002 Tran et al.

FOREIGN PATENT DOCUMENTS

| EP | 1 094 612 A1 | 4/2001 |
| EP | 1 122 890 A2 | 8/2001 |
| EP | 1 154 578 A2 | 11/2001 |
| EP | 1 204 211 A1 | 5/2002 |

OTHER PUBLICATIONS

Claude Berrou et al., "Near Shannon Limit Error—Correcting Coding and Decoding: Turbo-Codes (1)," In Proc. IEEE Int. Conf. Commun., Geneva, Switzerland, 1993, pp. 1064-1070.
L. R. Bahl et al., "Optimal Decoding of Linear Codes for Minimizing Symbol Error Rate", IEEE Transactions on Information Theory, Mar. 1974, pp. 284-287.

* cited by examiner

*Primary Examiner*—Guy Lamarre
*Assistant Examiner*—Esaw Abraham
(74) *Attorney, Agent, or Firm*—Venable LLP; Michael A. Sartori

(57) ABSTRACT

The present invention relates generally to error-correction coding and, more particularly, to a decoder for concatenated codes, e.g., turbo codes. The present invention provides a decoder for decoding encoded data, the decoder comprising: a processor having an input which receives probability estimates for a block of symbols, and which is arranged to calculates probability estimates for said symbols in a next iterative state; normalising means which normalises said next states estimates; a switch that receives both said normalised and said unnormalised next state estimates, the output of the switch being coupled to the input of the processor; wherein the switch is arranged to switch between the normalised and unnormalised next state estimates depending on the iterative state.

9 Claims, 16 Drawing Sheets

Overall Structure of Pipelined Beta Computation Path Diagram

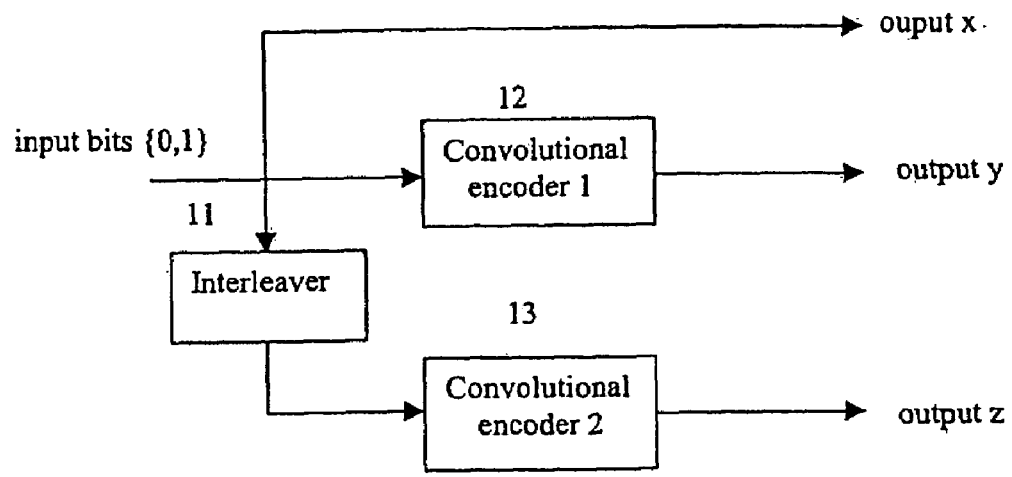
Figure 1 Basic Architecture of Turbo Encoder (Coding Rate = 1/3)
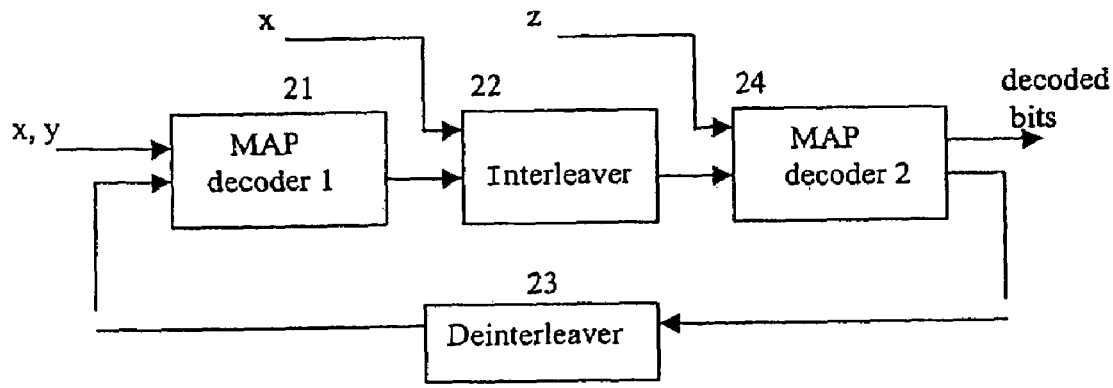
Figure 2 Basic Architecture of Turbo Decoder (Coding Rate = 1/3)

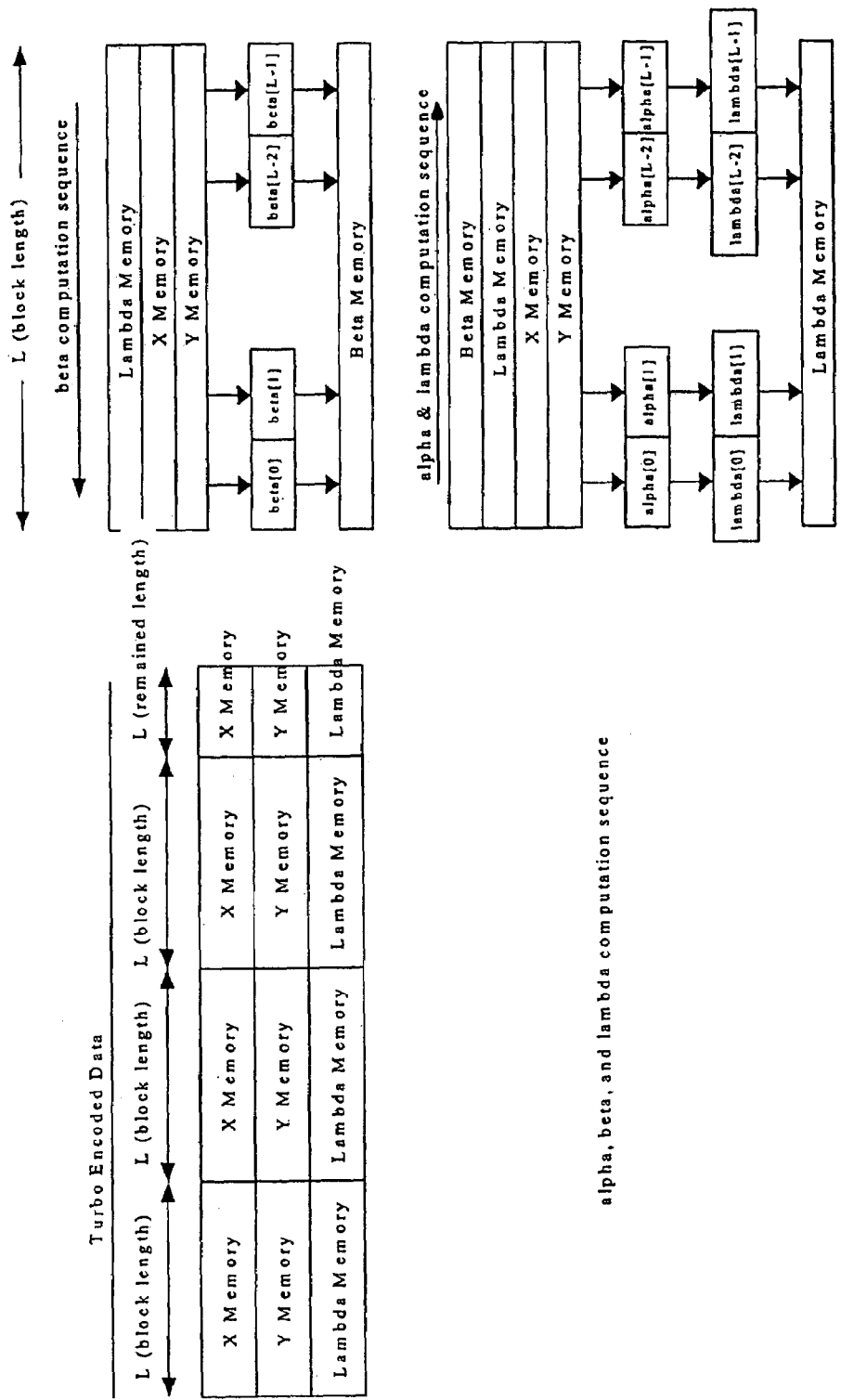
Figure 3. Alpha, Beta and Lambda Calculation Sequence

State Transition in Beta Computation

| State m | 0 | 1 | 2 | 3 | 4 | 5 | 6 | 7 |
|---|---|---|---|---|---|---|---|---|
| Next[m][0] | 0 | 4 | 5 | 1 | 2 | 6 | 7 | 3 |
| Next[m][1] | 4 | 0 | 1 | 5 | 6 | 2 | 3 | 7 |

State Transition in Alpha Computation

| State m | 0 | 1 | 2 | 3 | 4 | 5 | 6 | 7 |
|---|---|---|---|---|---|---|---|---|
| prev[m][0] | 0 | 3 | 4 | 7 | 1 | 2 | 5 | 6 |
| prev[m][1] | 1 | 2 | 5 | 6 | 0 | 3 | 4 | 7 |

Figure 4 State Transition in Beta and Alpha Computation.

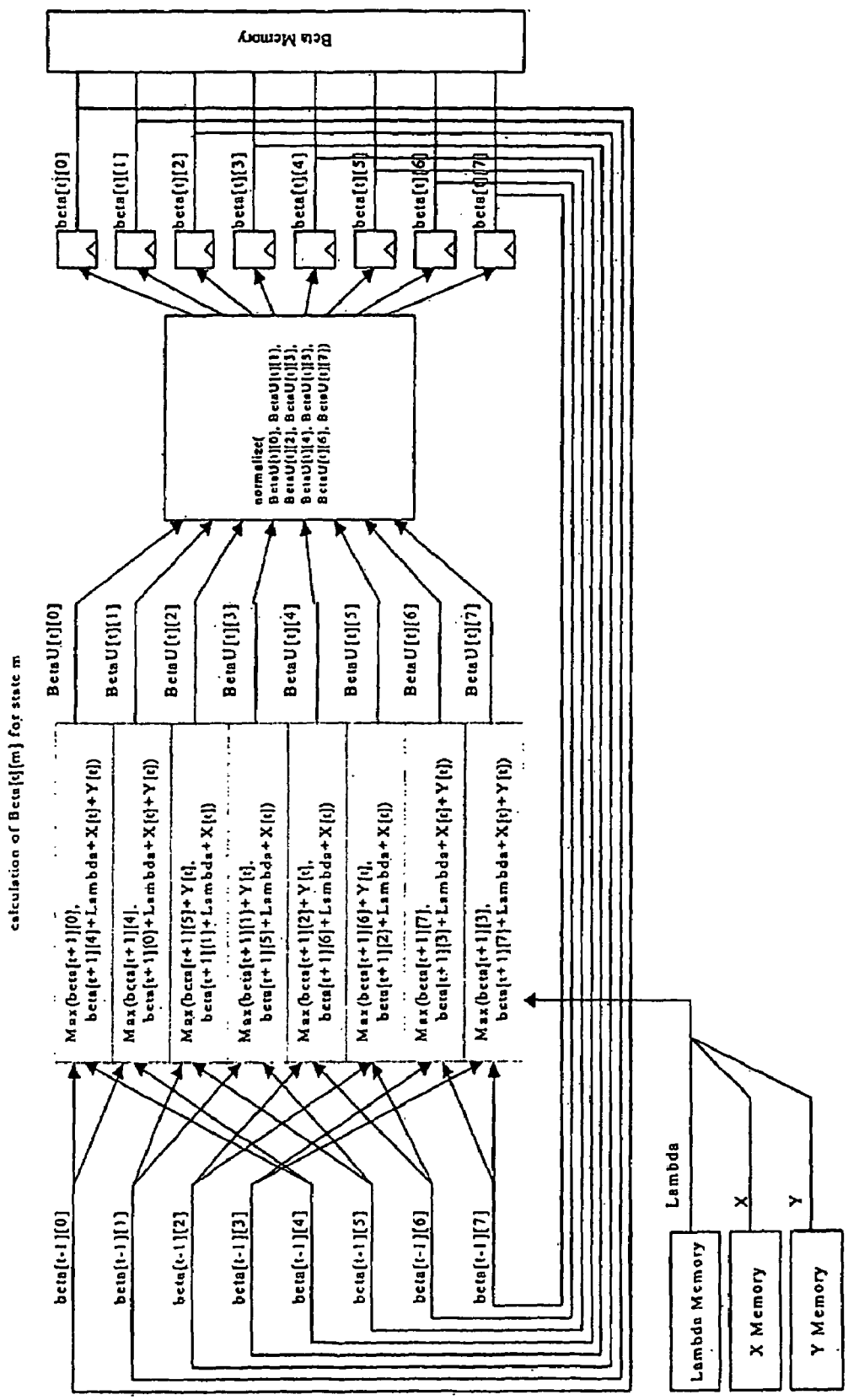
Figure 5. Beta Computation Block Diagram
Prior Art

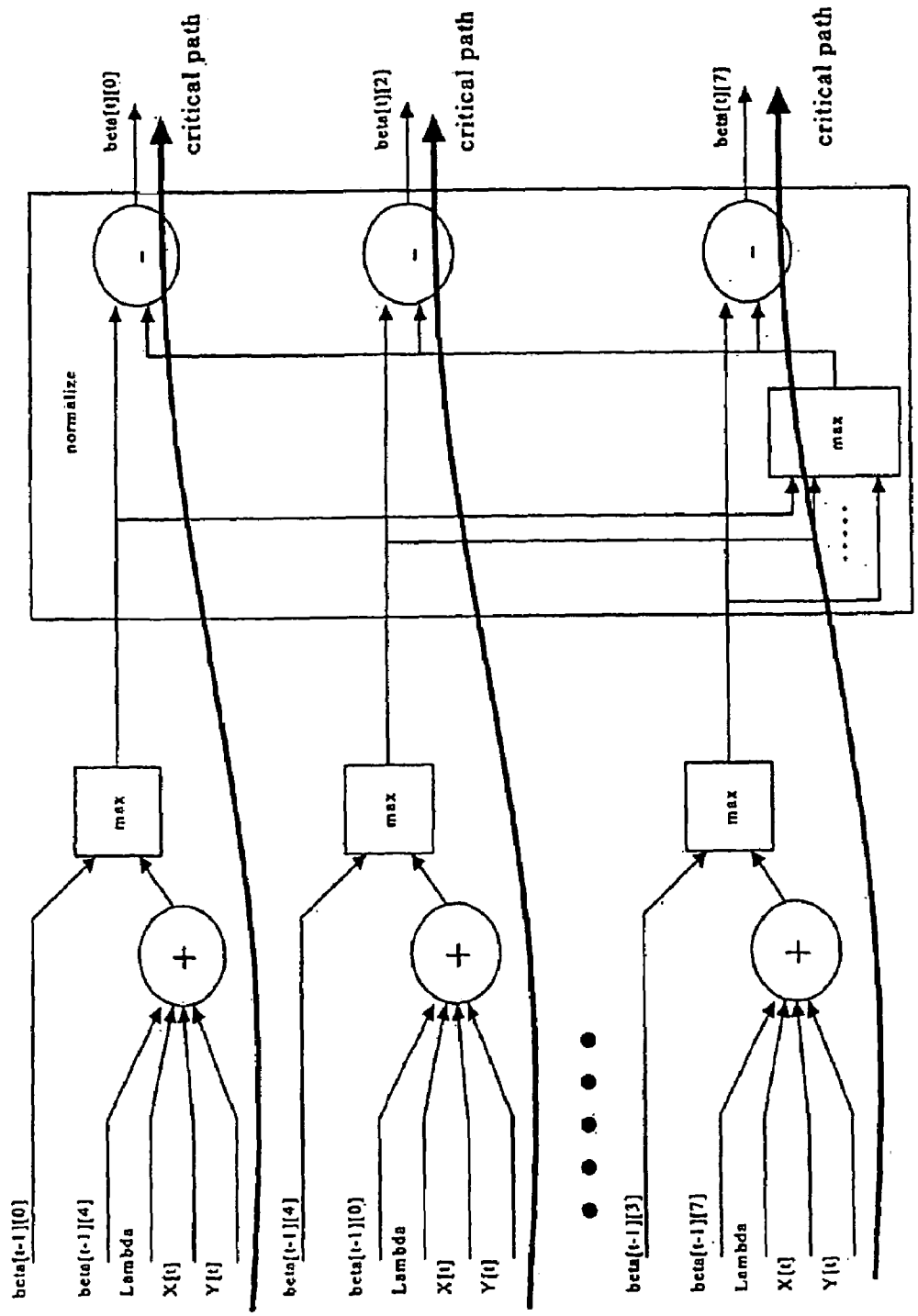
Figure 6 Details Beta Computation and Critical Path Block Diagram

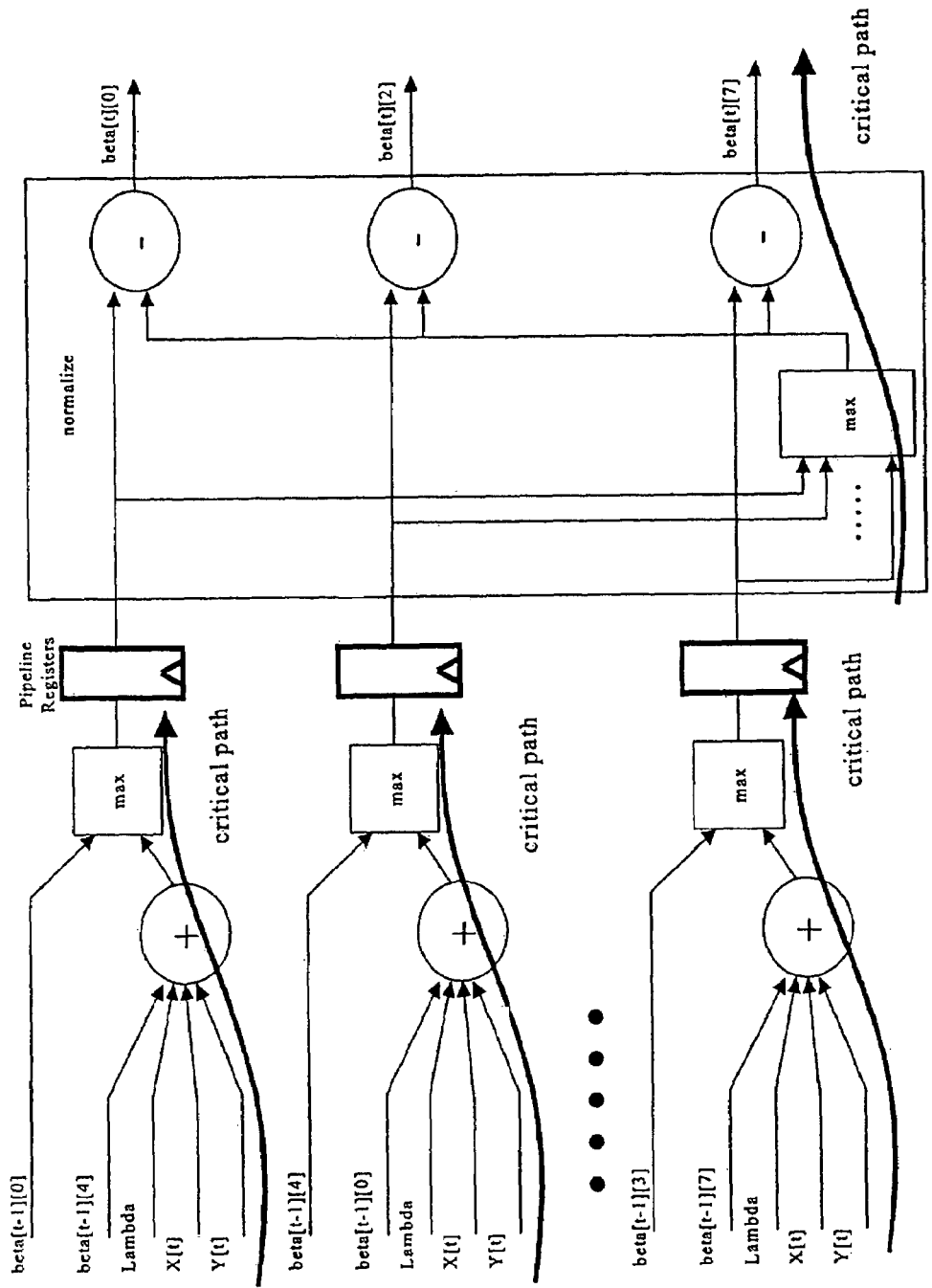
Figure 7: The Improved Structure of Beta Computation and Critical Path Diagram

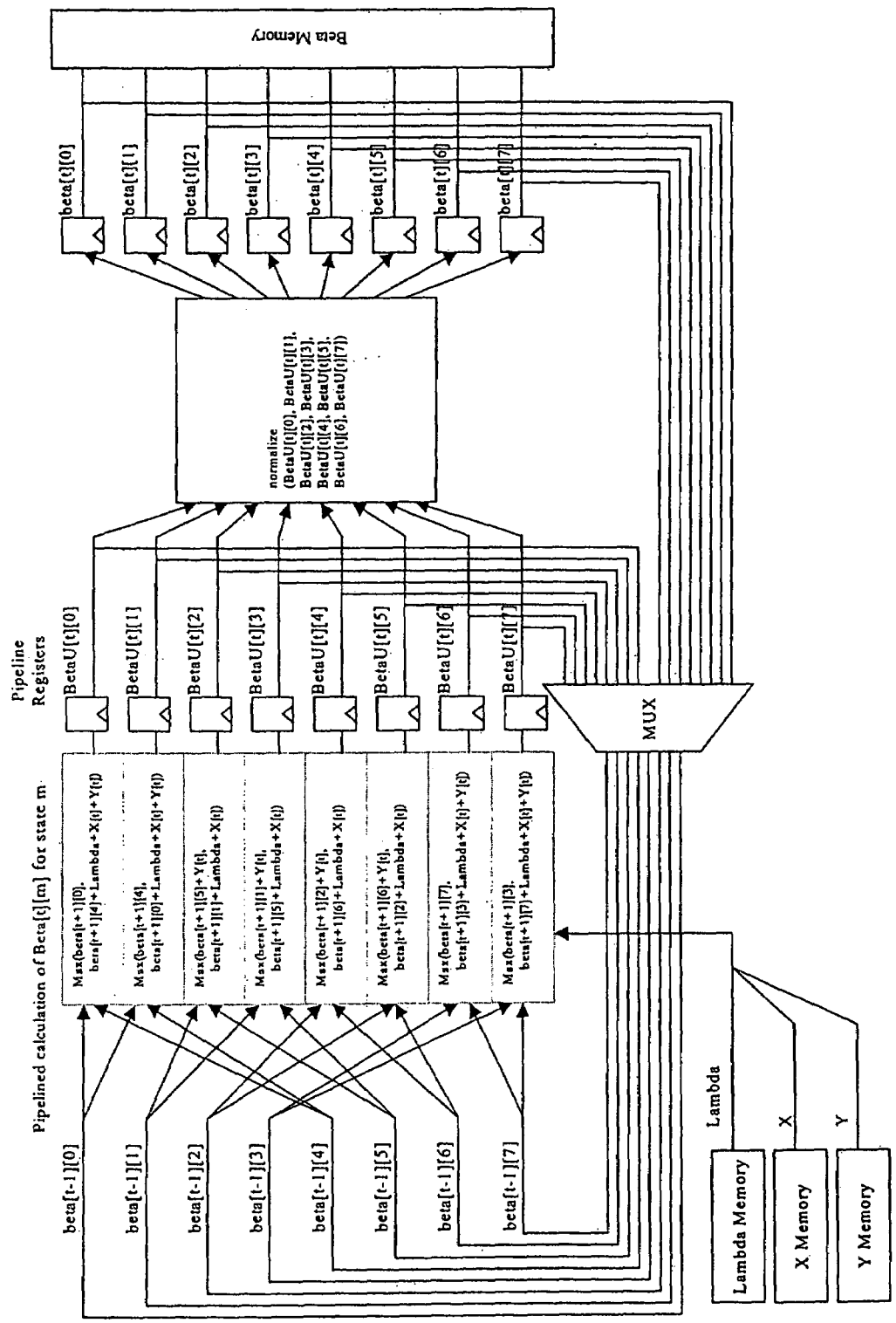
Figure 8 Overall Structure of Pipelined Beta Computation Path Diagram

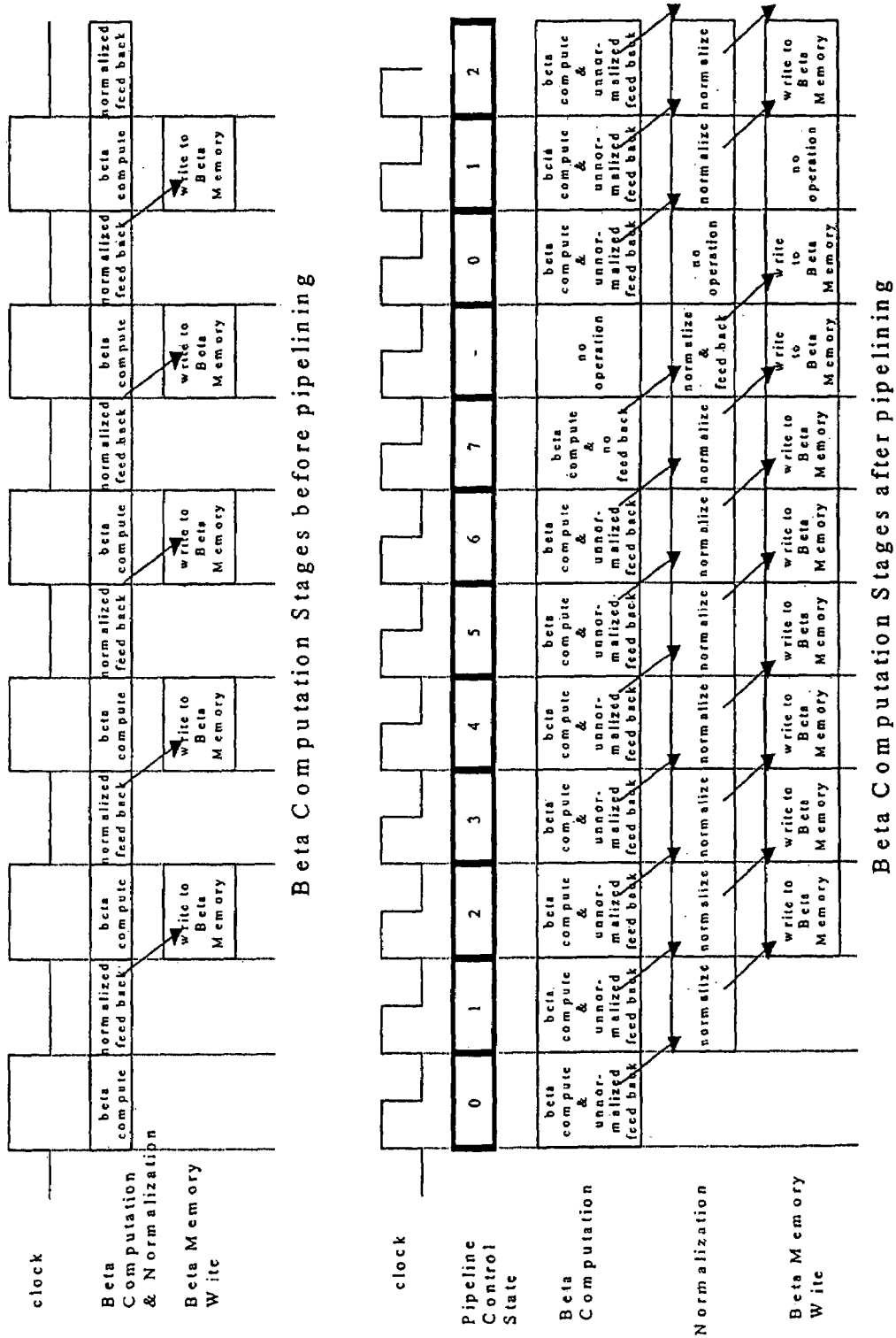
Figure 9 The pipeline Stages of Beta Computation Diagram

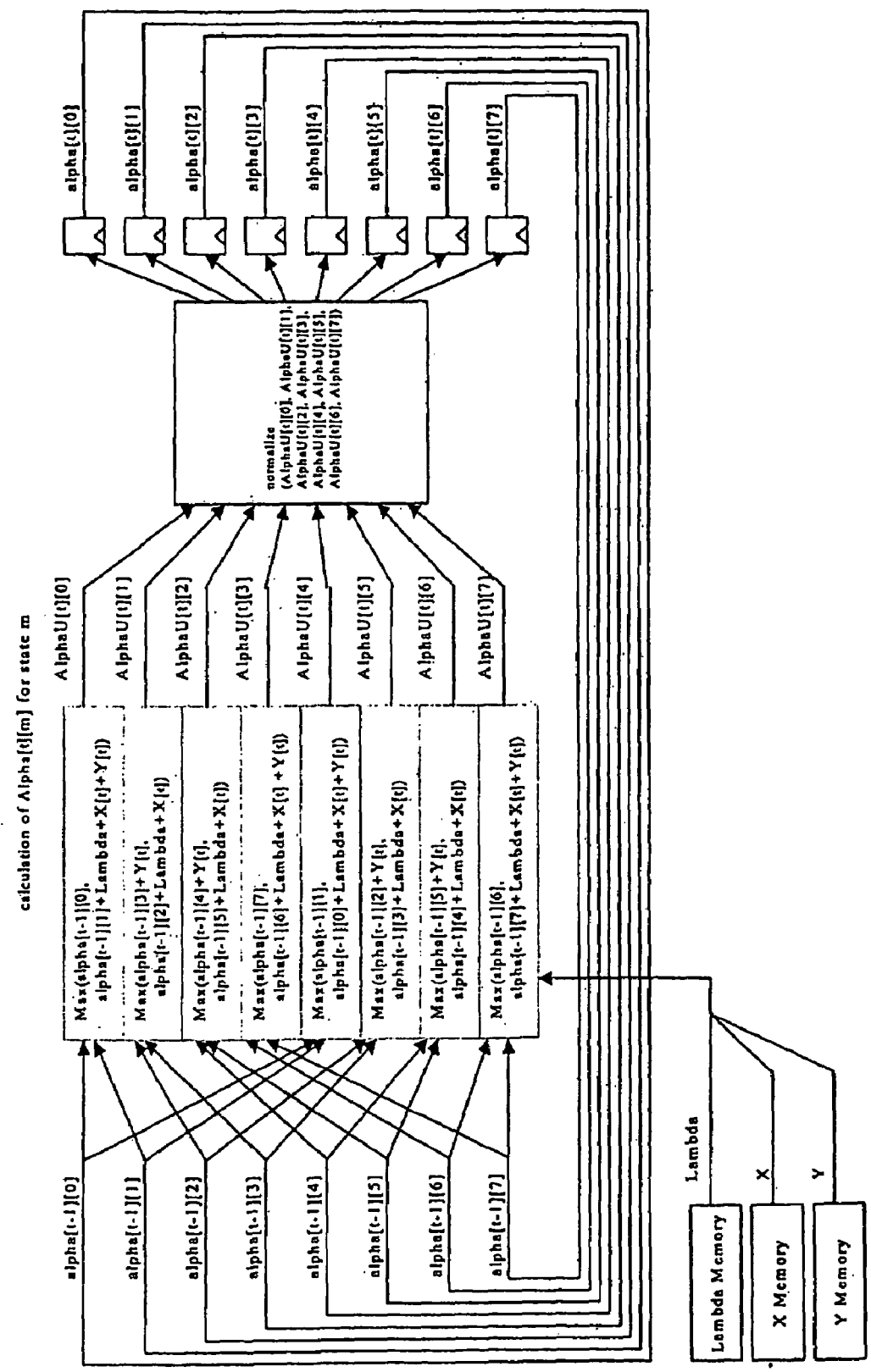
Figure 10 Alpha Computation Block Digram

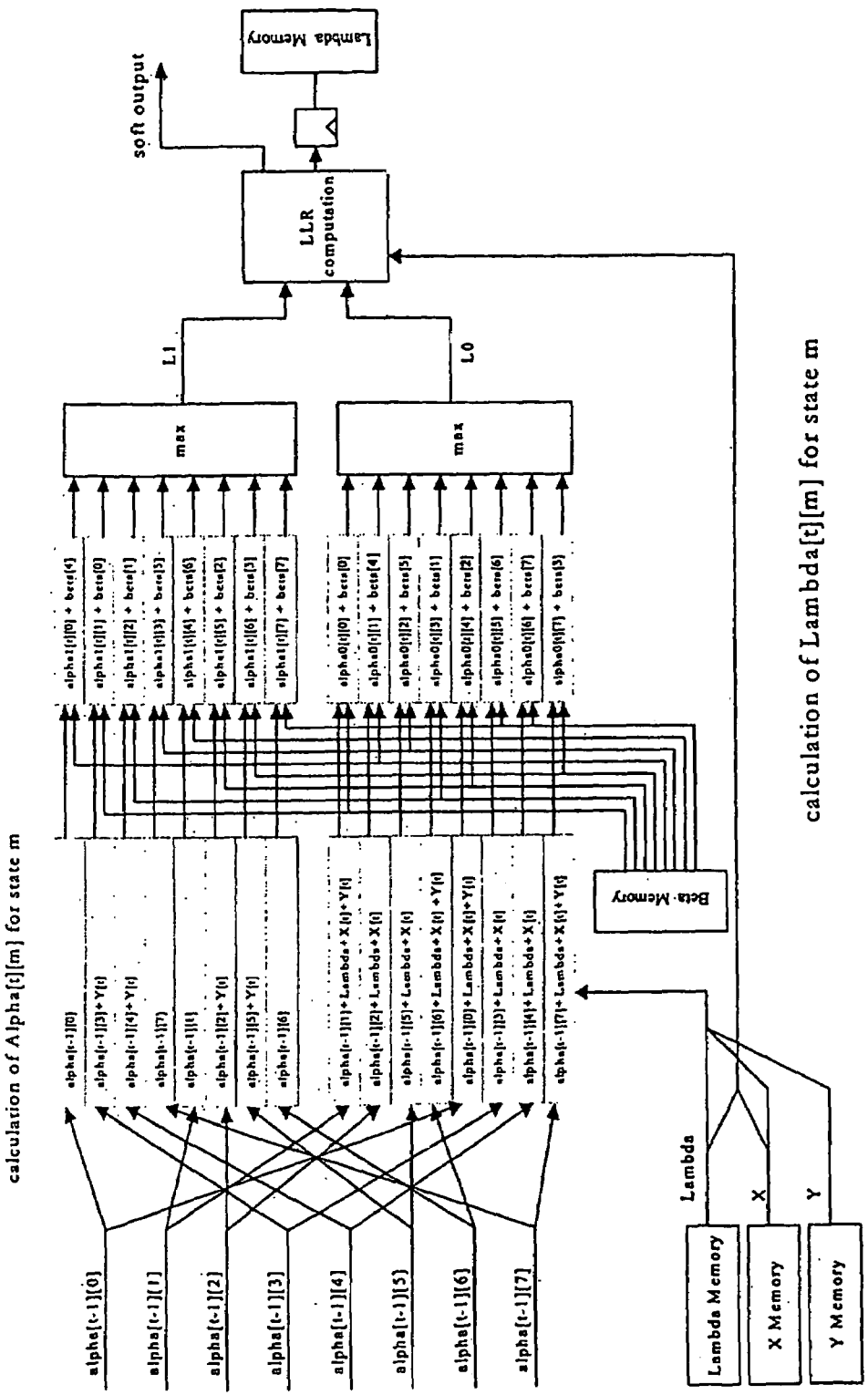
Figure 11 Lambda Computation Block Diagram        Prior Art

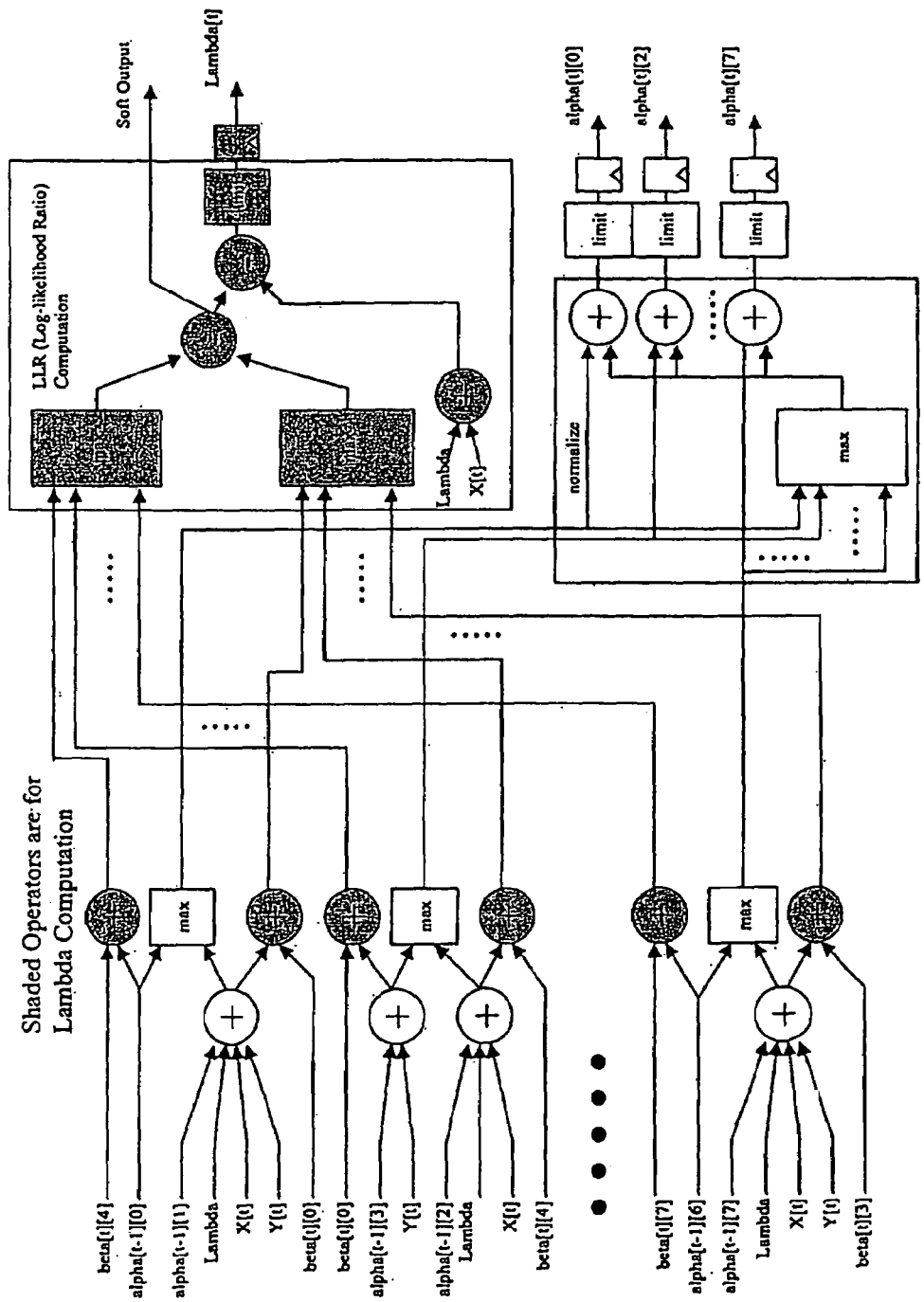
Figure 12 Details Alpha and Lambda Computation and Critical Path Block Diagram

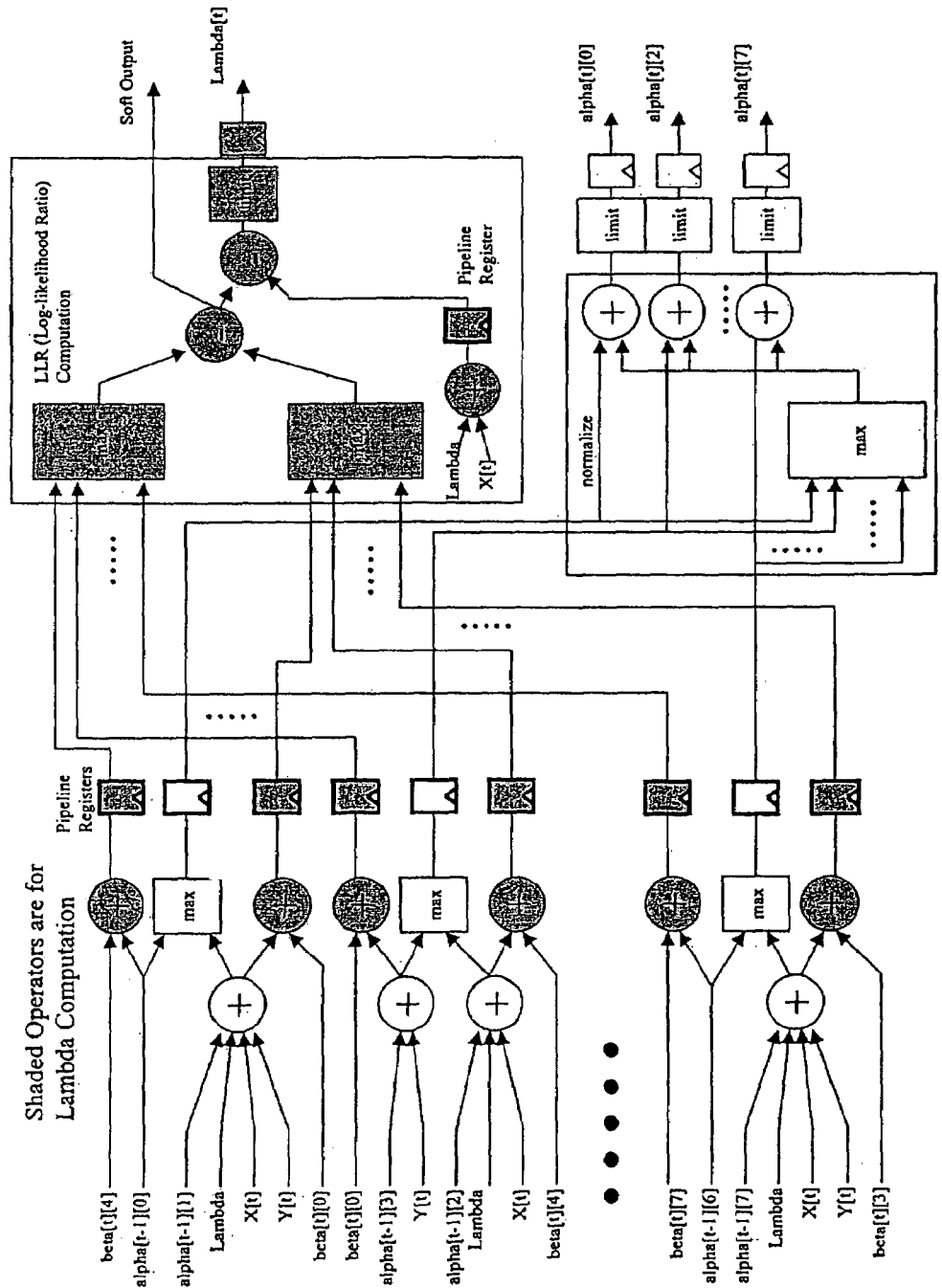
Figure 13 Improved Structure of Alpha and Lambda Computation and Critical Path Diagram

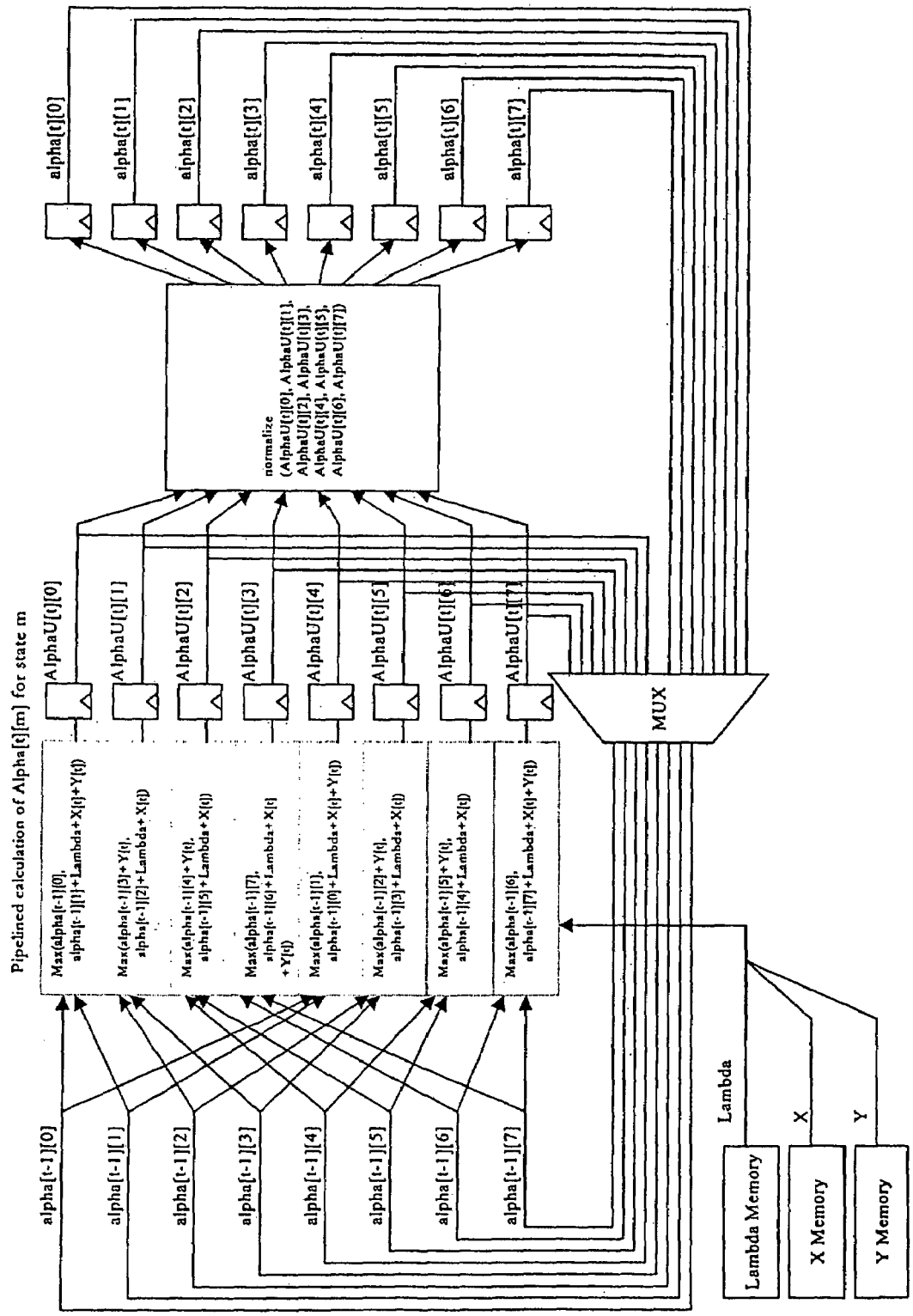
Figure 14 The Overall Structure of Pipelined Alpha Computation Path Diagram

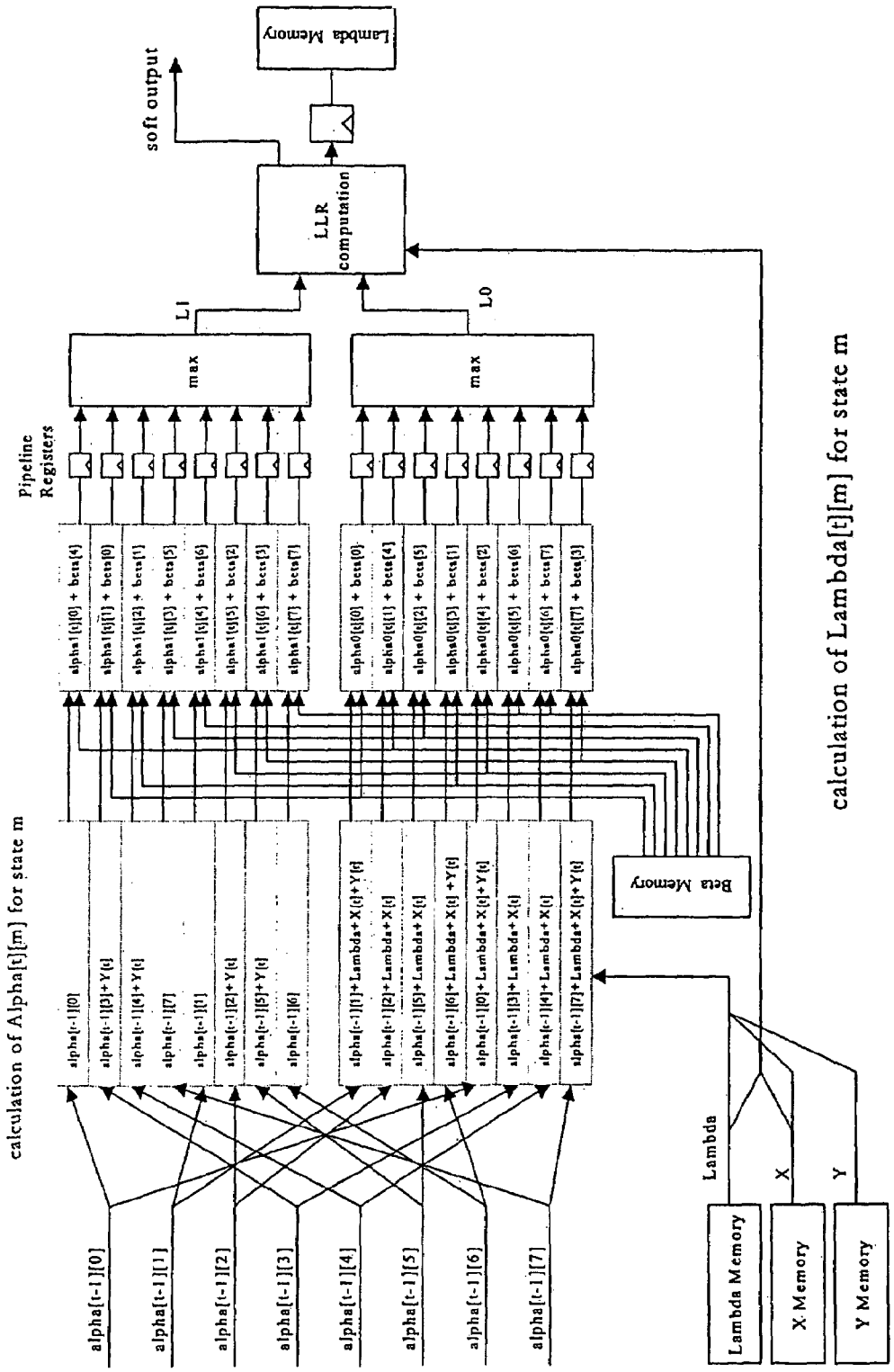
Figure 15 The Overall Structure of Pipelined Lambda Computation Path Diagram

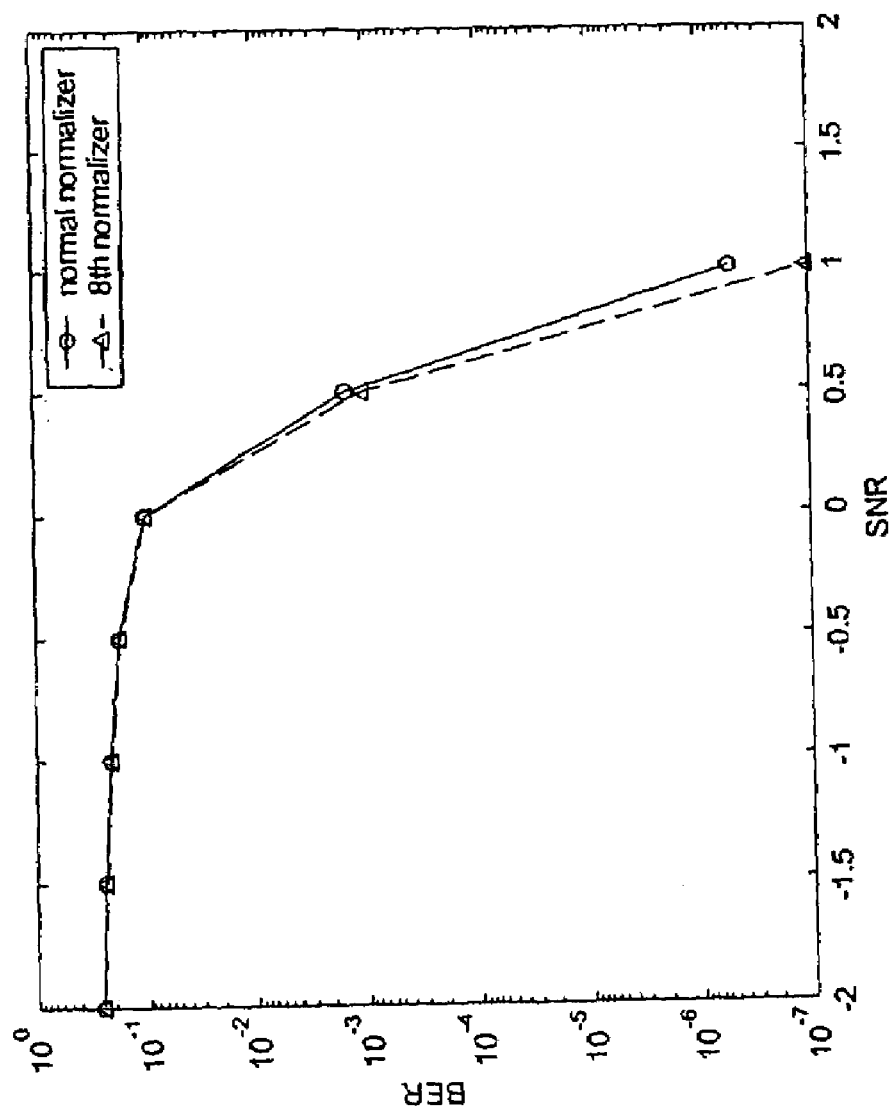
Figure 16 BER and SNR simulation for original normalization and new normalization Block length = 3856 bits)

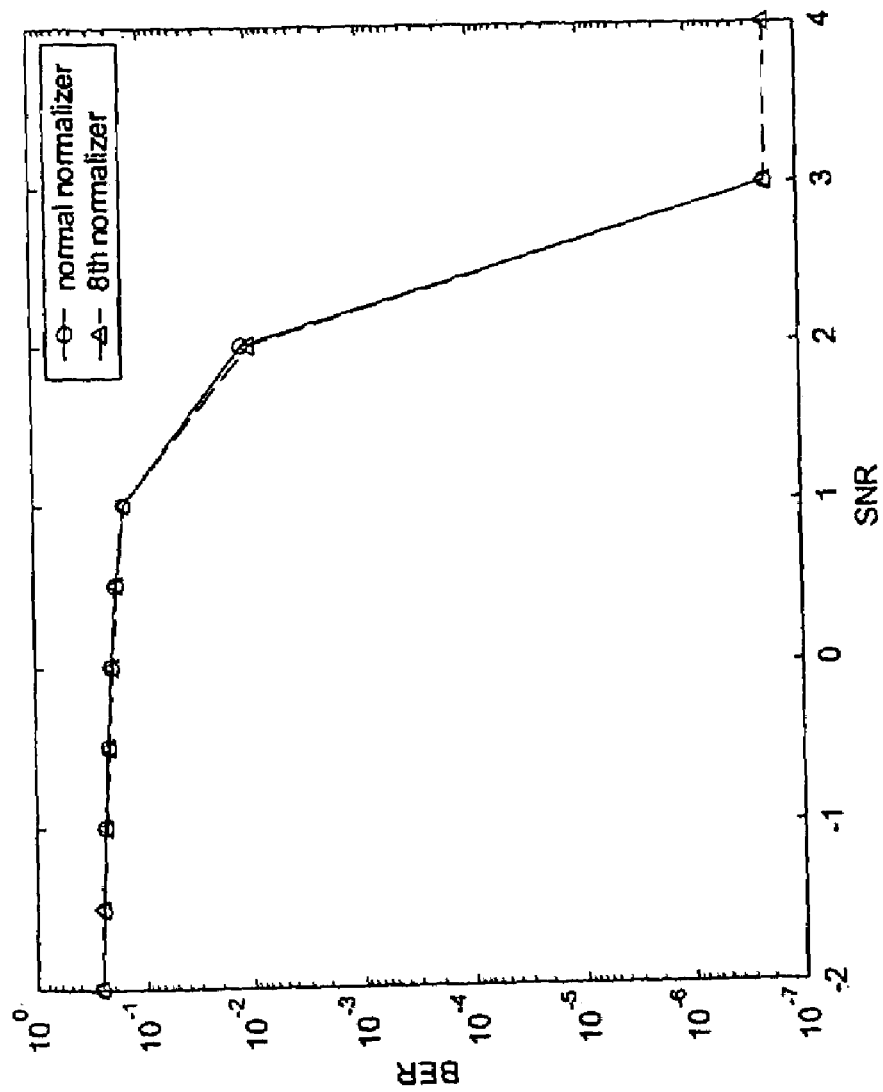
Figure 17 BER and SNR simulation for original normalization and new normalization (Block length = 5114 bits)

US 7,120,851 B2

RECURSIVE DECODER FOR SWITCHING BETWEEN NORMALIZED AND NON-NORMALIZED PROBABILITY ESTIMATES

FIELD OF THE INVENTION

The present invention relates generally to error-correction coding and, more particularly, to a decoder for concatenated codes, e.g., turbo codes.

BACKGROUND OF THE INVENTION

Data signals, in particular those transmitted over a typically hostile RF interface, are susceptible to errors caused by interference. Various methods of error correction coding have been developed in order to minimize the adverse effects that a hostile interface has on the integrity of communicated data. This is also referred to as lowering the Bit Error Rate (BER), which is generally defined as the ratio of incorrectly received information bits to the total number of received information bits. Error correction coding generally involves representing digital data in ways designed to be robust with respect to bit errors. Error correction coding enables a communication system to recover original data from a signal that has been corrupted. Typically, the greater the expected BER of a particular communication link, the greater the complexity of the error correction coding necessary to recover the original data. In general, the greater the complexity of the error correction coding, the greater the inefficiency of the data communication. The greater inefficiency results from a reduction of the ratio of information bits to total bits communicated as the complexity of the error correction coding increases. The additional information introduced into the original body of data by error correction coding consumes spectrum bandwidth and processor cycles on both the transmitting and receiving ends of the communication.

In cases where the expected BER of a particular communication link is substantially higher than the acceptable BER, a concatenated set of error correcting codes may be applied to the data in order to lower the BER to acceptable levels. Concatenated error correction coding refers to sequences of coding in which at least two encoding steps are performed on a data stream. Concatenated coding may be performed in series, where encoded data is subjected to further encoding, or in parallel where the original data is subjected to different encoding schemes to perform intermediate codes which are then further processed and combined into a serial stream.

Parallel and serial concatenated codes are sometimes decoded using iterative decoding algorithms. One commonly employed method of iterative decoding utilizes a single decoder processor where the decoder output metrics are fed back to the input of the decoder processor. Decoding is performed in an iterative fashion until the desired number of iterations have been performed. In order for the decoder processor to decode the encoded input data at the same rate as the input data is arriving, the decoder processor must process the encoded data at a rate faster than the rate of the incoming data by a factor at least equal to the number of iterations necessary. With this method of iterative decoding, the speed of the decoder processor becomes a significantly limiting factor in the system design.

Turbo codes are examples of parallel concatenated coding and are used as a technique of error correction in practical digital communications. The essence of the decoding technique of turbo codes is to produce soft decision outputs, i.e. different numerical values which describe the different reliability levels of the decoded symbols, which can be fed back to the start of the decoding process to improve the reliabilities of the symbols. This is known as the iterative decoding technique. Turbo decoding has been shown to perform close to the theoretical limit (Shannon limit) of error correction performance after 18 iterations—C. Beerou, A. Glavieux, and P. Thitimajshima, "Near Shannon Limit Error-Correcting Coding: Turbo Codes." In Proc. IEEE Int. Conf. Commun., Geneva, Switzerland, 1993, pp. 1064–1070. The Turbo Decoding algorithm is a very complex task as it takes up a large amount of computation time and consumes a lot of memory resources.

A turbo encoder is shown in FIG. 1 and comprises a pair of parallel-concatenated convolutional encoders (12, 13) separated by an interleaver (11), where the interleaver plays a role to shuffle (interleave) its input sequence in a predetermined order. It accepts an input binary {0,1} sequence of a specified code block of size N symbols, and produces three types of encoded output for each symbol when the coding rate is ⅓.

Referring to FIG. 2, a turbo decoder receives the encoded signals and uses all three types of signals when the coding rate is ⅓ to reproduce the original bit sequence of the turbo encoder input. Two MAP decoders 21 and 24, associated with the convolutional encoders 12 and 13 respectively, perform the decoding calculations. In addition to an interleaver 22 to mirror the interleaver 11 of the encoding side, the turbo decoder also consists of a deinterleaver 23 to reconstruct the correct arrangement of the bit sequence to be fed back from 24 to 21. The decoded bits after the final iteration are hard decisions, i.e. output binary sequence {0,1}, obtained from 24.

A MAP decoder uses the BCJR algorithm—see L. R. BAHL et al., "OPTIMAL DECODING OF LINEAR CODES FOR MINIMIZING SYMBOL ERROR RATE", IEEE Transactions on Information Theory, March 1974, pages 284–287—to compute the soft outputs, or likelihood. Using the received signals x, y and z, the algorithm computes three types of probabilities: $\alpha$ $\beta$ $\lambda$.

In a sense, $\alpha$ represents the likelihood probability of a symbol changing from a state m' to another state m as the time interval progresses from t to t+1. The $\beta$ probability, on the other hand, corresponds the likelihood probability of a symbol changing from a state m to m' from the time interval t to t-1. $\alpha$ and $\beta$ are also known as forward and backward probabilities. The initial values for $\alpha$ and $\beta$ are known because the states at the start and the end of the block L are set to zero in the turbo encoder. The $\lambda$ probability fuses $\alpha$ and $\beta$ together to obtain one measure of likelihood for each symbol. Then, the $\lambda$ will be used to compute the output of the turbo decoder which will be either the soft decisions (feedback) or the hard decisions ({0,1} bits).

These three probabilities must be computed sequentially, and normalized for each symbol. The computation sequences of $\alpha$, $\beta$, and $\lambda$ is briefly shown in FIG. 3. The state transitions in Beta and Alpha computation are shown in FIG. 4. The eight states correspond to the eight states of the constituent encoders in Turbo Encoder with ⅓ coding rate. There are two eight state constituent encoders, 12 and 13, in Turbo Encoder which follow the polynomials: $g^0(D)=1+D^2+D^3$ and $g_1(D)=1+D+D^3$ respectively. The Next[m][0] and Next[m][1] refer to next state as "0" and "1". The prev[m][0] and prev[m][1] refer to previous state as "0" and "1". The branch matrix computation of $\alpha$ and $\beta$ will follow the state transitions in FIG. 4.

As can be seen in the reference [Bahl et al], the α and β are independent of each other, but λ is dependent on α and β. A complete algorithm requires that the α and β probabilities for all symbols L to be used to calculate λ.

According to the general SubLogMAP Algorithm of Turbo Decoder, the procedure of Turbo decode is (a) to calculate β values, (b) to calculate α values and (c) to calculate λ finally as shown in FIG. 3. FIG. 5 shows the overall structure for the calculations of β, where the β computation and normalization are performed whose results are fed back to the β computation paths as well as written into the β memory which will be read out on the next phase (α and λ computation). The details and critical paths of β computation and normalization paths are shown in FIG. 6. FIG. 10 shows the LSI architecture for the calculations of α. The details and critical paths of α computation are shown in FIG. 12. There is a key operation, the normalization for β and α calculation to reduce the hardware amount. Normalization is needed to avoid the overflow of β and α computation. As shown in FIGS. 6 and 12, normalization process consists of (1) maximum values selection from the eight state values and (2) subtract of this maximum values from these eight state values, which will be fed back to the next computation. Because we are only interested in the maximum values of likelihood capabilities, this normalization is very effective to reduce the bit widths of the β and α computation data paths and various kinds of memories. Because the total calculation (β and α value computation and the normalization) is composed of fairly long critical paths as shown in FIG. 6 for β calculation and FIG. 12 for α calculation, the slower computation speed will be obtained. FIG. 11 shows the overall structure for the calculations of λ. The details and critical paths of λ computation paths are also shown in FIG. 12 (Shaded operation in the figure). As can be seen in FIG. 12, a lot of adders can be shared between the α and λ computation. There is also a long critical path from α value computation to LLR (Log-likelihood Ratio) computation for the calculations of λ.

The timing sequence of β computation is shown in the upper half portion (Beta Computation Stages Before Pipelining) of FIG. 9 as an example. As can be seen in this FIG. 9, each β computation and normalization is sequentially performed in one clock cycle, and the normalized β feedback is performed at the beginning of the next clock cycle. Similarly, each α computation and its normalization or λ computation and its LLR selection are sequentially performed in one clock cycle period. As shown in FIG. 6 and FIG. 12, the long critical path limits the speed of operating clock frequency. The calculation speed limitation of this architecture is caused by this longer clock cycle period time, in which the values of α and β are calculated.

As mentioned previously, the speed issue of turbo decoder implementation is the limitation of clock speed. The clock speed is decided by its cycle period in which the values of α and β are calculated. This is the critical path of the LSI implementation (or called maximum delay time of the calculation). There are two main operations (1) value calculation for α, β, and λ and (2) normalization for α and β, and LLR selection for λ in one clock cycle period to increase the critical path as shown in FIG. 6, FIG. 9 and FIG. 12. This kind of sequential operations slow down the clock speed. Recently, as turbo coding is applied to real systems for higher data rate transmission, we need to employ faster turbo decoding while keeping the buffer storage requirement as small as possible.

SUMMARY OF THE INVENTION

The present invention aims to provide a method and apparatus for iteratively decoding signals encoded with concatenated codes, including turbo codes.

In general terms, the present invention provides a recursive decoder having means for switching between normalised and non-normalised likelihood values or probability estimates (of received symbols) as feedback values for the next iteration of likelihood values. For example in a MAP algorithm for decoding turbo encoded signal symbols, the decoder is arranged to switch between normalised and non-normalised values of the alpha and beta values. This could also be applied to other algorithms.

In prior art arrangements a normalisation function is implemented after the iterative calculation function in order to obtain normalized values of next state likelihood values which are then fed back to the calculation function for the next iteration. Normalization is needed to avoid the overflow of β and α computation. However this requires a long clock cycle for each iteration, which limits the clock speed available. The invention avoids some of the calculation time associated with normalising each state's likelihood values by bypassing the normalisation function in the feedback circuit for some states using the switch. For example, by feeding back only normalised values for the last state, the speed of calculating the final (hard) likelihood values is essentially halved. Meanwhile the normalised values for each state are still written to memory in the usual manner.

This increased speed of determining the likelihood values is particularly advantageous in modern wireless communications systems where error coding is essential, but where it must be accomplished quickly given the increasing adoption of high bandwidth wireless applications such as video phones and web-browsing.

In particular, in a first aspect the present invention provides a decoder for decoding encoded data, the decoder comprising:

a processor having an input which receives probability estimates for a block of symbols, and which is arranged to calculates probability estimates for said symbols in a next iterative state;

normalising means which normalises said next states estimates;

a switch that receives both said normalised and said unnormalised next state estimates, the output of the switch being coupled to the input of the processor;

wherein the switch is arranged to switch between the normalised and unnormalised next state estimates depending on the iterative state.

In another aspect the present invention provides a decoder for decoding encoded data, the decoder comprising:

a processor having an input which receives probability estimates for a block of symbols, and which is arranged to calculate probability estimates for said symbols in a next iterative state;

normalising means coupled to the processor which normalises said next states estimates;

wherein the decoder further comprises pipelining means between the processor and the normalising means for providing non-normalised next state estimates.

These non-normalised next state estimates can then be fed back into the processor input to calculate the next next state estimates. This architecture halves the usual critical path into before and after pipelining means halves. Because this critical signal propagation delay is halved, the clock speed can be doubled, and hence the overall processor speed for the decoder is increased.

Preferably the decoder further comprises switching means that receives both said normalised and said unnormalised next state estimates, the output of the switch being coupled to the input of the processor;
wherein the switch is arranged to switch between the normalised and unnormalised next state estimates depending on the iterative state.

In another aspect there is provided a processor for a decoder for decoding encoded data, the processor comprising:
means for calculating probability estimates for a block of symbols said symbols in a next iterative state;
pipelining means which receives the next state estimates; and
normalising means which normalises said next states estimates.

As this part of the processor represents the critical path, by splitting this path with pipelining means, the clock speed can be increased and hence the overall decoder performance is enhanced, at the relatively modest hardware cost of adding some pipeline registers between the calculating means and the normalising means.

BRIEF DESCRIPTION OF THE DRAWINGS

Embodiments of the invention will now be described with reference to the following drawings, by way of example only and without intending to be limiting, in which:

FIG. 1 is a schematic of a basic turbo code encoder;

FIG. 2 is a schematic of a basic turbo code decoder;

FIG. 3 is shows a sequence schematic of alpha, beta and lambda calculations;

FIG. 4 shows state transitions in alpha and beta computation;

FIG. 5 shows a prior art beta computation block diagram;

FIG. 6 shows prior art beta computation and critical path diagram;

FIG. 7 shows beta computation and critical path diagram according to an embodiment of the invention;

FIG. 8 shows a beta computation block diagram according to an embodiment of the invention;

FIG. 9 shows the timing diagram of the stages of beta computation for both prior art and an embodiment of the invention;

FIG. 10 shows a prior art alpha computation block diagram;

FIG. 11 shows a prior art lambda computation block diagram;

FIG. 12 shows prior art alpha and lambda computation and critical path diagram;

FIG. 13 shows alpha and lambda computation and critical path diagram according to an embodiment of the invention;

FIG. 14 shows a alpha computation block diagram according to an embodiment of the invention;

FIG. 15 shows a lambda computation block diagram according to an embodiment of the invention;

FIG. 16 shows BER v SNR simulation results for a prior art decoder and an embodiment of the invention (Block length=3856 bits); and FIG. 17 shows BER v SNR simulation results for a prior art decoder and an embodiment of the invention (Block length=5114 bits).

DETAILED DESCRIPTION

Referring to FIG. 6, the critical paths of β computation data path and normalization data path are nearly equal. Actual logic synthesis results show that they have almost the same propagation delay. Similarly, looking at FIG. 12, the critical paths of α computation data path and its normalization paths, or the critical paths of λ computation data path and its LLR selection path are nearly equal. A first embodiment provides that we can divide these long critical paths into two pipeline stages.

FIG. 7 and FIG. 8 show the new architecture of the β calculation for the proposed implementation. As can be seen in FIG. 7, the pipeline registers are inserted between the β computation and its normalization, which means the calculation of β is finished in two clock cycles instead of one cycle as previously shown in the upper half portion (Beta Computation Stages before Pipelining) of FIG. 9. One stage is assigned for value computation and another is for the normalization. Because the critical paths in β computation and those in normalizer are equally balanced as described above, the clock speed will be doubled to improve the system performance. The clock speed can be doubled because the propagation delay is halved, but the calculation and the normalisation are still required. Their processing is pipelined. The splitting the critical path and/or doubling the clock speed speeds up the whole system performance with the similar hardware architecture. It means the new architecture has more powerful processing capabilities which is very important for Turbo Decoder, but without a significant increase hardware complexity. In order to reduce the latency from feedback loop, we have added another feedback loop from the unnormalized β values. This feedback selection is performed by MUX (multiplexer) in FIG. 8 to optionally choose the unnormalized β values (BetaU[t][0], BetaU[t][1], . . . , BetaU[t][7]) or normalizaed β values (beta[t][0], beta[t][1], . . . , beta[t][7]).

Because the normalized feedback is not performed for every β computation, we need to increase the bit width of the β computation data paths. Increasing the bit width added a little more hardware such as the registers and adders bit width. However this increases the system performance with high speed computation, with only a small amount of hardware added. However because the normalization is performed for every β value to be stored to the β memory, it is not necessary to widen the β memory bit width.

Preferably the feedback ratio of normalized values to the unnormalized values is set to ⅛, i.e., if a normalized feedback cycle is inserted after every eight unnormalized feedback cycles. According to simulation results, only two-bit increase of the computation data path is required. Whilst normalization is needed to avoid the overflow of β and α computation, system simulation shows that the performance is not affected (see FIGS. 16 and 17).

The lower half portion of FIG. 9 provides the detailed description of the timing sequence for this proposal for β calculation. The implementation architecture for original beta calculation is divided into two stages pipeline. The normalized feedback frequency is reduced to one time per every eight β value's computation. That's to use the unnormalized feedback value for next β value computation for first seven β value computations, and just to use the normalized value for the last β value computation, for every eight actual calculations. That means every eight calculations, there is an idle or no-operation cycle (invalidated pipeline cycle) in order to perform the β value computation with the normalized feedback for the last β calculation. The procedure of β calculating is pipelined to reduce the length of critical path into the half of the previous procedure. The speed of operating clock is 2 times faster than the previous design, which can be seen from the FIG. 9. The total throughput of β computation, therefore, is increased about double.

A similar implementation is applied to the α and λ computation paths. FIGS. 13, 14 and 15 show the pipelined structure of the α and λ computation paths, where the shaded operators are showing the λ computation path. The pipeline registers are inserted between the α computation and its normalization path, and also inserted between the λ computation and LLR selection paths as shown in the FIG. 13. The unnormalized α feedback is performed as shown in FIG. 14 by implementing MUX (multiplexer) to optionally choose the unnormalized α values (AlphaU[t][0], AlphaU[t][1], . . . , AlphaU[t][7]) or normalized α values (alpha[t][0], alpha[t][1], . . . , alpha[t][7]).

Because there is no feedback loop is needed for the λ computation path, we can divide this path into two stages at any arbitrary portion of the λ computation As can be seen in FIG. 13, the λ computation path is very similar with the β or α computation paths, it is suitable to insert the pipeline registers between the λ computation path and LLR selection path.

The detailed description of the timing sequence for the previous design and this proposal for α calculation is same as the one of β calculation, which is shown in FIG. 9. The implementation architecture for original α calculation is modified as two stages pipeline. The normalization feedback frequency is reduced to one time per every eight α value's computation. That's to use the unnormalized feedback value for next α value computation for first seven α value computations, and just to use the normalized value for the last α value computation, for every eight actual calculations.

That means every eight calculations, there is an idle cycle in order to perform the a value computation with the normalized feedback for the last α calculation. The procedure of α calculating is pipelined to reduce the length of critical path into the half of the previous procedure. The speed of operating clock is 2 times faster than the previous design, which can be also seen from the FIG. 9.

From the above description and the architectures diagrams in FIGS. 5, 6, 7, 8 and 9, the processing speed can be improved by two time faster compared with the implementation of the prior art. This is achieved by using the embodiment of pipeline computation implementation architecture and reduced normalization feedback computation for the values of β computation. We can save a lot of hardware resources (adders, max, and registers) by enabling the resource sharing between the Beta and Alpha computation to reduce the hardware amount. Beta and Alpha computations are timing sharing to use the same hardware module by timing control switch. The embodiment uses the same minimum memory storage of the prior art.

Furthermore, the proposed implementation will not have any effect on the performance of the decoder because the calculations of the probabilities are the same as the ones used in the prior art. FIG. 16 and FIG. 17 show the BER performance simulation comparison between the original normalization scheme (normalization feedback for every calculation) and the new normalization scheme for block bit length 3856 and 5114.

The various features of the described embodiments of the invention may be freely combined. Alterations and modifications as would be obvious to those skilled in the art are intended to be incorporated within the scope hereof.

The invention claimed is:

1. A decoder for decoding encoded data, the decoder comprising:
    a processor having an input which receives probability estimates for a block of symbols, and which is arranged to calculate probability estimates for said symbols in a next iterative state;
    normalizing means for normalizing said calculated probability estimates to provide normalized probability estimates;
    a switch arranged to receive both said calculated probability estimates and said normalized probability estimates, an output of the switch being coupled to the input of the processor;
    wherein the switch is arranged to switch between the calculated probability estimates and the normalized probability estimates depending on the iterative state.

2. The decoder according to claim 1 wherein said decoder comprises a MAP algorithm wherein the probability estimates are α and β values.

3. The decoder according to claim 1 wherein said decoder has eight iterative states for each received symbol block.

4. The decoder according to claim 1 wherein the ratio between said calculated probability estimates and said normalized probability estimates is 7:1.

5. The decoder according to claim 1 wherein said switch is a multiplexer.

6. The decoder according to claim 1 further comprising pipeline registers between said processor and said normalizing function.

7. A turbo decoder comprising the decoder according to claim 1.

8. A decoder for decoding encoded data, the decoder comprising:
    a processor having an input which receives probability estimates for a block of symbols, and which is arranged to calculate probability estimates for said symbols in a next iterative state;
    normalizing means coupled to the processor for normalizing said calculated probability estimates to provide normalized probability estimates;
    pipelining means between the processor and the normalizing means for providing non-normalized probability estimates; and
    switching means for receiving both said calculated probability estimates and said normalized probability estimates, an output of the switching means being coupled to the input of the processor;
    wherein the switching means is arranged to switch between the calculated probability estimates and the normalized probability estimates depending on the iterative state.

9. The decoder according to claim 8 wherein said pipelining means is a pipeline register coupled between outputs of said processor and inputs of said normalizing means.

* * * * *